United States Patent [19]
Cho

[11] Patent Number: 5,670,427
[45] Date of Patent: Sep. 23, 1997

[54] METHOD FOR FORMING METAL CONTACTS IN SEMICONDUCTOR DEVICES

[75] Inventor: Gyung-Su Cho, Kyoungki-do, Rep. of Korea

[73] Assignee: Hyundai Electronics Industries Co., Ltd., Ich'on, Rep. of Korea

[21] Appl. No.: 610,716

[22] Filed: Mar. 4, 1996

[30] Foreign Application Priority Data

Mar. 4, 1995 [KR] Rep. of Korea ............... 4452/95

[51] Int. Cl.$^6$ ................... H01L 21/283; H01L 21/31
[52] U.S. Cl. ........................... 437/195; 437/228
[58] Field of Search .................... 437/180, 187, 437/189, 195, 228, 192; 156/659.11, 661.11

[56] References Cited

U.S. PATENT DOCUMENTS

| | | | |
|---|---|---|---|
| 5,126,006 | 6/1992 | Cronin et al. | 156/643.1 |
| 5,318,925 | 6/1994 | Kim | 437/195 |
| 5,358,903 | 10/1994 | Kim | 437/195 |
| 5,468,664 | 11/1995 | Kajita | 437/43 |
| 5,516,625 | 5/1996 | McNamara et al. | 430/314 |

Primary Examiner—T. N. Quach
Attorney, Agent, or Firm—Ware, Fressola, Van Der Sluys & Adolphson LLP

[57] ABSTRACT

A method for forming metal contacts in an integrated circuit, comprises the steps of: forming a first insulating layer on a silicon substrate; forming and patterning a first metal layer on the first insulating layer; forming and patterning a photoresist layer on the first insulating layer and the first metal pattern such that portions of the first insulating layer and first metal pattern are partially exposed; etching the exposed portion of the first metal pattern using the photoresist pattern to form a fine metal pattern; removing the photoresist pattern; depositing a second insulating layer on the overall surface of the structure; removing the second insulating layer to a depth until the fine metal pattern is exposed; coating a third photoresist layer on a surface of the second insulating layer and a surface of the fine metal pattern; patterning the third photoresist layer such that the surface of the fine metal pattern and portions of the surface of the second insulating layer adjacent to and on both sides of the fine metal pattern are covered; etching the second insulating layer using the third photoresist pattern to form spaces in the second insulating layer; removing the third photoresist pattern; forming a second metal layer to fill the spaces in the second insulating layer; and removing the second metal layers until a top surface of the second insulating layer is exposed to thereby form metal contacts.

7 Claims, 3 Drawing Sheets

METHOD FOR FORMING METAL CONTACTS IN SEMICONDUCTOR DEVICES

FIELD OF THE INVENTION

This invention relates to a method for fabricating a semiconductor device, and more particularly to the method for forming metal contacts in the semiconductor device using fine patterns.

BACKGROUND OF THE INVENTION

During the past several years, a continuing trend has been towards the development of semiconductor devices having small dimensions, on the order of 0.5 μm or less to increase the packing density of devices on an integrated circuit chip. Particularly in the area of MOS transistor memories, gate widths and associated contact dimensions continue to be scaled down to increase not only the circuit density on the chip but to also improve the circuit performance by increased operation speeds.

As the gate widths of MOS transistors become smaller, the widths of the source and drain regions adjacent to the gates also become smaller, and thus, there is the increasing need for a finer pattern.

Generally, in the fabrication of semiconductor devices according to the conventional method for forming fine patterns, an insulating layer or a conductive layer is first coated with a photoresist polymer. Following the deposition of the thus formed photoresist polymer, the thus formed photoresist polymer layer is then patterned using commonly known photolithographic process. The insulating layer or conductive layer, underlying the photoresist pattern formed above, is then etched in the form of the photoresist pattern by conventional techniques.

FIG. 1 is sideview schematic diagrams showing the conventional method for forming fine contacts using fine photoresist patterns. An insulating layer, for example oxide layer 2 is formed on a semiconductive substrate or a conductive layer 1. The insulating layer 2 is formed in order to isolate metal lines from the semiconductive substrate or the conductive layer 1. A photoresist layer is then coated on the insulating layer 2. Following the coating of the photoresist layer, a photoresist pattern (not shown) is formed using common photolithograhic process to the finest size such that the current exposure apparatus may obtain. The underlying insulating layer 2 is then etched, thereby forming contact holes such that the semiconductive substrate or conductive layer is exposed in the predetermined area. A metal layer 3 is then deposited on an entire surface of the resulting structure. Accordingly, the metal layer would make direct contact to the exposed substrate.

The process for forming contact holes using a previous photolithography process is closely related with the diffraction of light. The reason will be described in detail as follows.

Resolution (R), which determines the attainable limit of the contact size, is one of the important factors in the photolithographic process. It is determined as the following Rayleigh's equation, $$R = k(\lambda/NA)$$

wherein, R is resolution, λ is the wavelength of light, NA is the number of the lens opening, and k is the constant which is adjusted according to the process conditions. In the mass production step, k is about 0.7. In addition, in a case where an I-line with a λ of 0.356 μm and an G-line with a λ 0.436 μm are used in the mass production and NA is 2, the minimum resolution that the current apparatus may obtain is about 0.5 to 0.6 μm considering the diffraction of light.

In the production process however, effective channel length is currently on a decreasing trend to about 0.5 μm and thus the junction regions become smaller and more shallow.

Accordingly, it has been found necessary to provide finer contact holes less than 0.5 to 0.6 μm, which is the attainable size using conventional exposure apparatus.

SUMMARY OF THE INVENTION

It is one object of the present invention to provide a method for forming metal contacts by attaining fine patterns having a size less than the previous minimum linewidth using the current exposure apparatus.

The above object is achieved by a process for forming metal contacts, comprising the steps of: (a) providing a silicon substrate; (b) forming a first insulating layer on the substrate; (c) forming and patterning a first metal layer into a first metal pattern on the first insulating layer; (d) forming and patterning a photoresist layer on the first insulating layer and the first metal pattern such that a portion of said first insulating layer and a portion of the first metal pattern are partially exposed; (e) etching the exposed portion of the first metal pattern using the photoresist pattern to thereby form a fine metal pattern; and (f) removing the photoresist pattern.

In addition, the above object is achieved by a process for forming metal contacts, further comprising the steps of: (g) depositing a second insulating layer on the overall surface of the structure having the fine metal pattern disposed on the insulating layer; (h) removing the second insulating layer to a depth until the fine metal contact is exposed; (i) coating a third photoresist layer on the surface of the second insulating layer and the fine metal pattern; (j) patterning the third photoresist layer such that the surface of the fine metal contact and the surface of adjacent portions of the second insulating layer to both sides of the fine metal pattern are covered; (k) etching the second insulating layer using the third photoresist pattern; (l) removing the third photoresist pattern; (m) forming a second metal layer to a degree capable of filling the spaces between the insulating layer; and (n) removing the second metal layers until the top surface of the second insulating layer is exposed to thereby form the metal contacts.

BRIEF DESCRIPTION OF THE DRAWING

The object and advantages of this invention will become apparent upon reading the following detailed description and upon reference to the drawings in which.

DESCRIPTION OF THE PREFERRED EMBODIMENT

Figure 1:
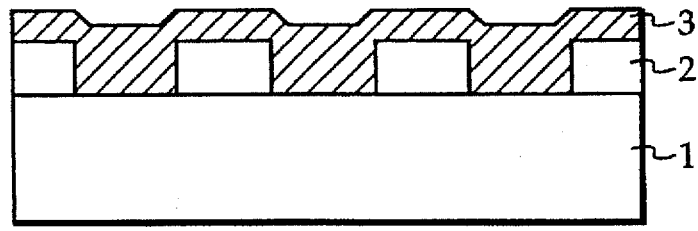
FIG. 1 is sideview schematic diagrams showing a previous method for forming fine metal contacts using fine photoresist patterns.
Figure 2:
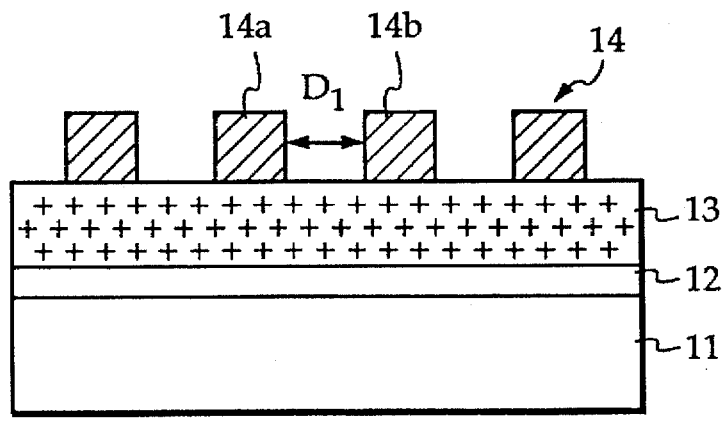
FIGS. 2–8 are cross sectional views showing sequentially a series of steps in the fabrication of metal contacts according to a preferred embodiment of the invention.

The terms contact or via are used interchangeably herein to describe contacts. Referring now to FIG. 2, there is shown a conventional silicon substrate 11. The structure is shown having a first insulating layer, for example, an insulating oxide layer 12 disposed thereon. Any conventional thin insulating layer may be used, such as TEOS or CVD oxide layer. Deposited on the insulating layer 12 is a first metal layer 13. The silicon substrate 11 may be a semiconductor body having active devices (not shown) formed therein. In addition, the substrate 11 may be a P type or N type substrate. The doping type of the substrate does not play a significant role in the present process. Coated on the surface of the first metal layer 13 is a relatively thick first photoresist layer. Next, the first photoresist layer is patterned by the exposure and development processes, and a first photoresist pattern 14 is thus formed. The first photoresist pattern 14 is formed such that a distance D between one island 14a of the photoresist pattern and an adjacent island 14b is of a minimum length. The minimum length preferably is the length attainable in the photolithography process currently available. It should be realized, however, that the invention is applicable to photolithographic techniques developed in the future which may be capable of smaller minimum lengths than currently attainable.

Figure 3:
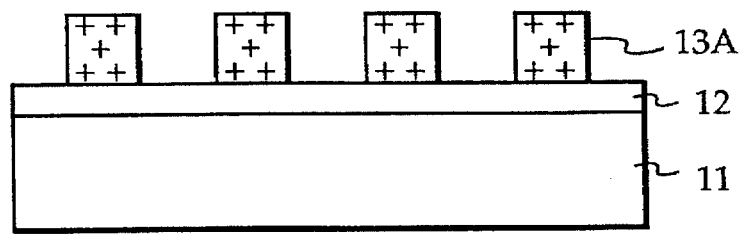

As shown in FIG. 3, the underlying first metal layer 13 is then etched using the first photoresist pattern 14 as a mask and thus a metal pattern 13A is formed. After the formation of the metal pattern 13A, the first photoresist pattern 14 is removed using a plasma ashing method.

Figure 4:
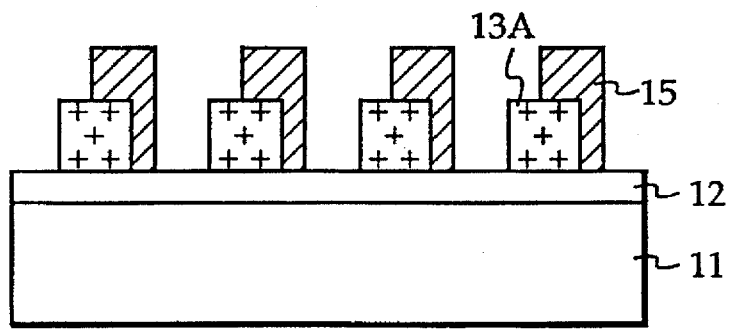

Coated on an entire surface of the structure of FIG. 4 is a second photoresist layer. The second photoresist layer is patterned using a conventional photolithographic process and a second photoresist pattern 15 is thus formed. The second photoresist pattern 15 is formed such that a portion of the metal pattern 13A formed in the etching stage is exposed in accordance with the teachings of this invention. In the patterning stage of the second photoresist layer, the second photoresist layer is patterned such that a portion of the first insulating layer is also exposed.

Figure 5:
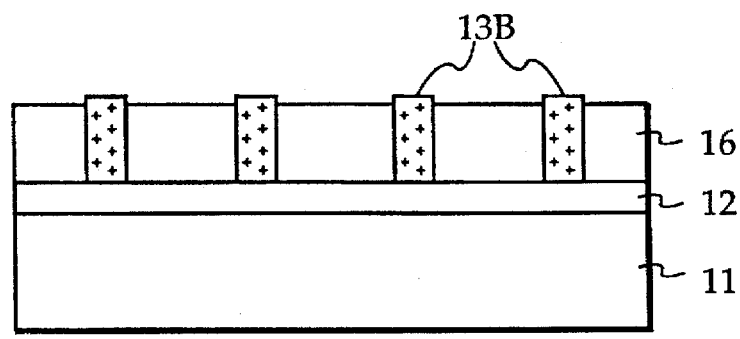

Next, the metal pattern 13A is etched using the second photoresist pattern 15 and thus a fine metal pattern 13B is formed. The fine metal pattern 13B has a smaller width than the metal pattern 13A formed according to techniques in the prior art. The width of fine metal pattern 13B is adjustable by the position of the second photoresist pattern 15 at the stage of the formation of the second photoresist pattern 15. Next, the second photoresist pattern 15 is removed by the conventional means. A second insulating layer 16 is deposited on the surface of the overall structure, and thus, filling in open spaces of the fine metal pattern 13B disposed on the insulating layer 12. In addition, the second insulating layer 16 is a different material having an etching rate different from that of the first insulating layer 12. Next, the second insulating layer 16 is etched by the plasma etching or chemical-mechanical polishing to the distance until the fine metal pattern 13B is exposed as shown in FIG. 5. That is to say, the second insulating layer 16 is etched until the top of the second insulating layer 16 is level with or near the top of the fine metal pattern 13B. Accordingly, a planarization of the semiconductor body is formed and the regions between the fine metal pattern 13B is filled with the second insulating layer 16.

Figure 6:
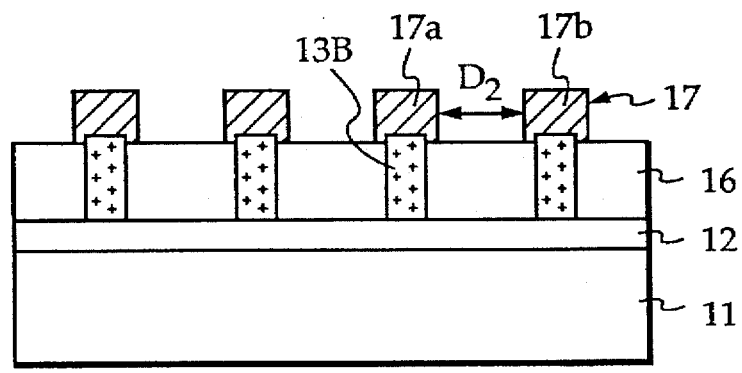

As shown in FIG. 6, on the surface of the second insulating layer 16 and the fine metal pattern 13B is then formed a third photoresist layer 17. The third photoresist layer is patterned by the conventional exposure and development process such that the surface of the fine metal pattern 13B and the surface of adjacent portions of the second insulating layer to both sides of the fine metal pattern are covered. The third photoresist pattern 17 is thus formed. Preferably, the distance D2 between one island 17a of the third photoresist pattern 17 and an adjacent island 17b is the same as the distance D1 between one island 14a of the first photoresist pattern 14 and its adjacent island 14b. It is also preferable that the first and third photoresist patterns have the same shape.

Figure 7:
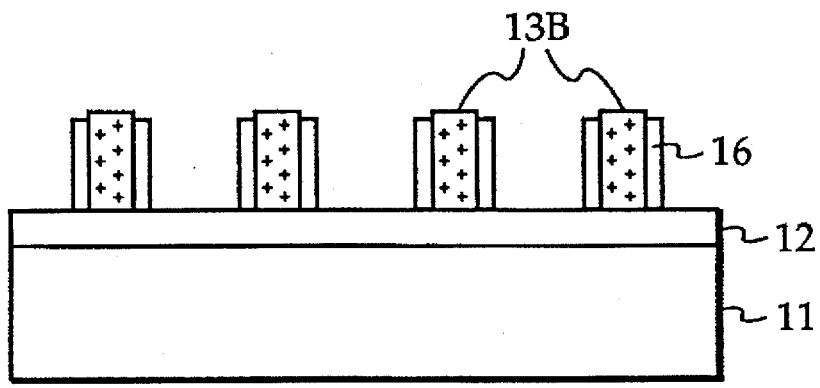

As shown in FIG. 7, the second insulating layer 16 is etched using the third photoresist pattern 17. Following the etch of the second insulating layer 16, the third photoresist pattern 17 is removed.

Figure 8:
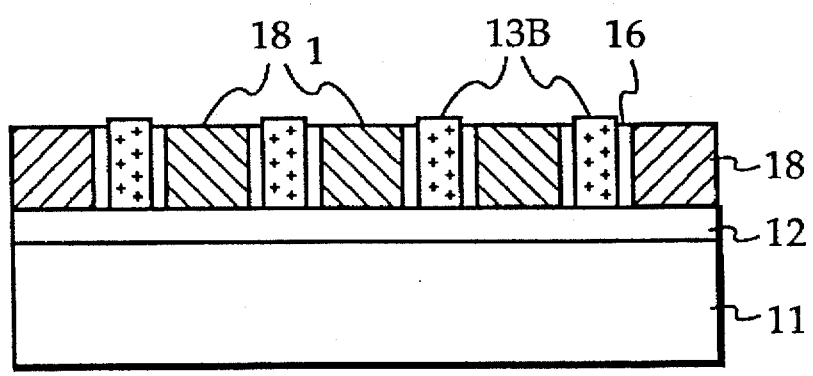

As shown in FIG. 8, a second metal layer 18 is deposited to a degree capable of sufficiently filling the spaces between the insulating layer 16 by sputtering method. Next, the second metal layer is etched by plasma blanket etching method or chemical mechanical polishing method such that the top surface of the second insulating is exposed forming a planarized structure. Thus, the metal contacts are formed. In presently contemplated embodiments, without limitation, the fine metal pattern is about 1000 Å to about 5000 Å smaller in width than the metal contact.

This invention may be applied to highly integrated semiconductor devices by forming the fine metal pattern at the stage of the formation of the metal contacts using the conventional exposure apparatus.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed:

1. The method for forming metal contacts in an integrated circuit, comprising the steps of:

(a) providing a silicon substrate;

(b) forming a first insulating layer on said substrate;

(c) forming and patterning a first metal layer into a first metal pattern on said first insulating layer;

(d) forming and patterning a photoresist layer on said first insulating layer and said first metal pattern such that a portion of said first insulating layer and a portion of the first metal pattern are partially exposed;

(e) etching the exposed portion of the first metal pattern using the photoresist pattern to thereby form a fine metal pattern;

(f) removing the photoresist pattern;

(g) depositing a second insulating layer on the overall surface of the structure having the fine metal pattern disposed on the insulating layer;

(h) removing the second insulating layer to a depth until the fine metal pattern is exposed;

(i) coating a third photoresist layer on a surface of the second insulating layer and a surface of the fine metal pattern;

(j) patterning the third photoresist layer such that the surface of the fine metal pattern and portions of the surface of the second insulating layer adjacent to and on both sides of the fine metal pattern are covered;

(k) etching the second insulating layer using the third photoresist pattern to form spaces in the second insulating layer;

(l) removing the third photoresist pattern;

(m) forming a second metal layer to fill the spaces in the second insulating layer; and (n) removing the second metal layers until a top surface of the second insulating layer is exposed to thereby form metal contacts.

2. The method of claim 1, wherein said fine metal pattern is about 1000 Å to about 5000 Å smaller in width than the metal contact.

3. The method of claim 1, wherein said second insulating layer is removed by a plasma blanket etching method to the depth until the fine metal pattern is exposed.

4. The method of claim 1, wherein said second insulating layer is removed by a chemical mechanical polishing method to the depth until the fine metal contact is exposed.

5. The method of claim 1 wherein the second metal layer is removed by a plasma etching method.

6. The method of claim 1 wherein the second metal layer is removed by a chemical mechanical polishing method.

7. The method of claim 1 wherein the second insulating layer is a material having different etching rate from the first insulating layer.

* * * * *